(12) United States Patent
Chen et al.

(10) Patent No.: US 9,599,896 B2
(45) Date of Patent: Mar. 21, 2017

(54) PHOTORESIST SYSTEM AND METHOD

(71) Applicant: Taiwan Semiconductor Manufacturing Company, Ltd., Hsin-Chu (TW)

(72) Inventors: Chien-Chih Chen, Taipei (TW); Cheng-Han Wu, Taichung (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 14/213,302

(22) Filed: Mar. 14, 2014

(65) Prior Publication Data

US 2015/0261087 A1    Sep. 17, 2015

(51) Int. Cl.
*G03F 7/004* (2006.01)
*H01L 21/027* (2006.01)
(Continued)

(52) U.S. Cl.
CPC ........ *G03F 7/0045* (2013.01); *C11D 11/0047* (2013.01); *G03F 7/0392* (2013.01); *G03F 7/091* (2013.01); *G03F 7/423* (2013.01); *G03F 7/427* (2013.01); *H01L 21/0274* (2013.01); *H01L 21/265* (2013.01); *H01L 21/266* (2013.01); *H01L 21/2658* (2013.01); *H01L 21/31133* (2013.01); *H01L 21/31138* (2013.01)

(58) Field of Classification Search
CPC ........... H01L 21/0274; H01L 21/31133; H01L 21/31138; H01L 21/265; G03F 7/423; G03F 7/427; G03F 7/426; G03F 7/0045; G03F 7/027; G03F 7/0388
USPC .......... 510/175, 176; 257/E21.334, E21.256, 257/E21.311; 438/689, 514, 745, 706; 430/311, 319, 322, 325, 329, 331
See application file for complete search history.

(56) References Cited

U.S. PATENT DOCUMENTS 4,072,527 A    2/1978 Fan
4,212,935 A    7/1980 Canavello et al.
(Continued)

FOREIGN PATENT DOCUMENTS

EP    1500977    1/2005
JP    2006145788    6/2006
(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.
(Continued)

*Primary Examiner* — Amanda C Walke
(74) *Attorney, Agent, or Firm* — Slater Matsil, LLP

(57) ABSTRACT

In an embodiment a radical inhibitor is included within a photoresist in order to reduce the amount of cross-linking that occurs during subsequent processing, such as an ion implantation process, that would otherwise form a crust within the photoresist. The crust can be removed in a separate process, such as a dry etch with an oxidative or reductive etchant. Alternatively, the crust may be treated to make it more hydrophyilic such that it can be removed simultaneously with the photoresist.

21 Claims, 9 Drawing Sheets

(51) Int. Cl.

| | |
|---|---|
| *H01L 21/266* | (2006.01) |
| *G03F 7/42* | (2006.01) |
| *H01L 21/265* | (2006.01) |
| *H01L 21/311* | (2006.01) |
| *C11D 11/00* | (2006.01) |
| *G03F 7/09* | (2006.01) |
| *G03F 7/039* | (2006.01) |

(56) References Cited

U.S. PATENT DOCUMENTS

| | | | |
|---|---|---|---|
| 4,268,601 A | 5/1981 | Namiki et al. | |
| 4,289,845 A | 9/1981 | Bowden et al. | |
| 4,346,164 A | 8/1982 | Tabarelli et al. | |
| 4,491,628 A | 1/1985 | Ito et al. | |
| 4,663,275 A | 5/1987 | West et al. | |
| 4,777,119 A | 10/1988 | Brault et al. | |
| 4,939,070 A | 7/1990 | Brunsvold et al. | |
| 5,002,850 A | 3/1991 | Shinozaki et al. | |
| 5,268,260 A | 12/1993 | Bantu et al. | |
| 5,288,588 A | 2/1994 | Yukawa et al. | |
| 5,738,975 A | 4/1998 | Nakano et al. | |
| 5,750,312 A | 5/1998 | Chandross et al. | |
| 5,766,824 A | 6/1998 | Batchelder et al. | |
| 5,811,358 A * | 9/1998 | Tseng .............. | H01L 21/31138 |
| | | | 204/192.36 |
| 5,856,065 A | 1/1999 | Hagen | |
| 5,863,710 A | 1/1999 | Wakiya et al. | |
| 5,886,102 A | 3/1999 | Sinta et al. | |
| 5,889,141 A | 3/1999 | Marrocco, III et al. | |
| 6,008,265 A | 12/1999 | Vallee et al. | |
| 6,147,249 A | 11/2000 | Watanabe et al. | |
| 6,187,504 B1 | 2/2001 | Suwa et al. | |
| 6,296,984 B1 * | 10/2001 | Gabor .............. | G03F 7/0045 |
| | | | 430/270.1 |
| 6,306,554 B1 | 10/2001 | Barclay et al. | |
| 6,383,717 B1 * | 5/2002 | Fiebag ............. | G03F 7/322 |
| | | | 430/302 |
| 6,524,936 B2 * | 2/2003 | Hallock ............ | G03F 7/42 |
| | | | 438/531 |
| 6,627,377 B1 | 9/2003 | Itatani et al. | |
| 6,787,289 B2 | 9/2004 | Yamada et al. | |
| 6,788,477 B2 | 9/2004 | Lin | |
| 6,790,579 B1 | 9/2004 | Goodall et al. | |
| 6,835,527 B2 | 12/2004 | Takata et al. | |
| 6,852,473 B2 | 2/2005 | Martin et al. | |
| 6,872,503 B2 | 3/2005 | Wheland et al. | |
| 6,875,554 B2 | 4/2005 | Hatanaka et al. | |
| 6,936,400 B2 | 8/2005 | Takasu et al. | |
| 6,952,253 B2 | 10/2005 | Lof et al. | |
| 6,991,888 B2 | 1/2006 | Padmanaban et al. | |
| 7,195,860 B2 | 3/2007 | Endo et al. | |
| 7,235,348 B2 | 6/2007 | Ho et al. | |
| 7,264,918 B2 | 9/2007 | Endo et al. | |
| 7,312,014 B2 | 12/2007 | Maesawa et al. | |
| 7,320,855 B2 | 1/2008 | Huang et al. | |
| 7,339,007 B2 * | 3/2008 | Irving .............. | C08F 8/14 |
| | | | 525/333.7 |
| 7,344,970 B2 | 3/2008 | Forman et al. | |
| 7,362,412 B2 | 4/2008 | Holmes et al. | |
| 7,393,624 B2 | 7/2008 | Allen et al. | |
| 7,432,035 B2 | 10/2008 | Maeda et al. | |
| 7,432,042 B2 | 10/2008 | Chang et al. | |
| 7,435,686 B2 * | 10/2008 | Verhaverbeke ...... | G03F 7/423 |
| | | | 257/E21.255 |
| 7,460,206 B2 | 12/2008 | Weissenrieder et al. | |
| 7,470,503 B1 | 12/2008 | Brandl | |
| 7,582,398 B2 | 9/2009 | Iftime et al. | |
| 7,585,612 B2 | 9/2009 | Thackeray et al. | |
| 7,595,141 B2 | 9/2009 | Kudo et al. | |
| 7,608,386 B2 | 10/2009 | Nozaki et al. | |
| 7,648,815 B2 | 1/2010 | Itatani et al. | |
| 7,718,541 B2 | 5/2010 | Makiyama et al. | |
| 7,733,459 B2 | 6/2010 | Dierichs et al. | |
| 7,738,074 B2 | 6/2010 | Streefkerk et al. | |
| 7,779,781 B2 | 8/2010 | Mertens et al. | |
| 7,824,837 B2 | 11/2010 | Wu et al. | |
| 7,846,637 B2 | 12/2010 | Ishizuka et al. | |
| 7,879,529 B2 | 2/2011 | Endo et al. | |
| 7,919,222 B2 | 4/2011 | Vohra et al. | |
| 7,959,141 B2 | 6/2011 | Makino | |
| 7,985,534 B2 | 7/2011 | Tsubaki | |
| 7,989,578 B2 | 8/2011 | Wu | |
| 7,998,655 B2 | 8/2011 | Tsubaki | |
| 8,017,304 B2 | 9/2011 | Tarutani et al. | |
| 8,039,559 B2 * | 10/2011 | Jansen ............ | C08F 283/01 |
| | | | 524/781 |
| 8,071,272 B2 | 12/2011 | Tsubaki | |
| 8,088,548 B2 | 1/2012 | Houlihan et al. | |
| 8,088,557 B2 | 1/2012 | Tsubaki | |
| 8,105,748 B2 | 1/2012 | Ohashi et al. | |
| 8,257,901 B2 | 9/2012 | Kim et al. | |
| 8,323,870 B2 | 12/2012 | Lee et al. | |
| 8,329,387 B2 | 12/2012 | Yao et al. | |
| 8,334,338 B2 | 12/2012 | Yoshimura et al. | |
| 8,460,856 B2 | 6/2013 | Yeh et al. | |
| 8,507,177 B2 | 8/2013 | Wang et al. | |
| 8,518,628 B2 | 8/2013 | Chang et al. | |
| 8,563,408 B2 * | 10/2013 | Afzali-Ardakani ...... | G03F 7/40 |
| | | | 257/E21.473 |
| 8,586,290 B2 | 11/2013 | Wang et al. | |
| 8,592,133 B2 * | 11/2013 | Watanabe ........... | G03F 7/0045 |
| | | | 430/270.1 |
| 8,772,170 B2 * | 7/2014 | Raghavan .......... | G03F 7/423 |
| | | | 438/705 |
| 9,269,629 B2 * | 2/2016 | Cheng ............. | H01L 21/02227 |
| 9,281,382 B2 * | 3/2016 | Liu ................ | H01L 29/66795 |
| 2001/0044070 A1 | 11/2001 | Uetani et al. | |
| 2002/0015826 A1 | 2/2002 | Desmarteau et al. | |
| 2002/0051933 A1 | 5/2002 | Kodama et al. | |
| 2002/0068237 A1 | 6/2002 | Imai | |
| 2002/0151156 A1 * | 10/2002 | Hallock ............ | G03F 7/42 |
| | | | 438/531 |
| 2003/0022097 A1 | 1/2003 | Malik et al. | |
| 2003/0073027 A1 | 4/2003 | Namiki et al. | |
| 2003/0079764 A1 | 5/2003 | Hirose et al. | |
| 2003/0087179 A1 | 5/2003 | Iwasaki | |
| 2003/0175624 A1 | 9/2003 | Nozaki et al. | |
| 2003/0198887 A1 * | 10/2003 | Glatt .............. | C08F 8/00 |
| | | | 430/175 |
| 2004/0084150 A1 | 5/2004 | George et al. | |
| 2004/0096780 A1 | 5/2004 | Nozaki et al. | |
| 2004/0161698 A1 | 8/2004 | Kanagasabapathy et al. | |
| 2004/0180299 A1 | 9/2004 | Rolland et al. | |
| 2004/0266077 A1 * | 12/2004 | Yeo ............... | H01L 29/785 |
| | | | 438/157 |
| 2004/0266115 A1 * | 12/2004 | Chan .............. | H01L 29/42384 |
| | | | 438/284 |
| 2005/0134817 A1 | 6/2005 | Nakamura | |
| 2005/0145803 A1 | 7/2005 | Hakey et al. | |
| 2005/0145821 A1 | 7/2005 | French et al. | |
| 2005/0225737 A1 | 10/2005 | Weissenrieder et al. | |
| 2005/0266354 A1 | 12/2005 | Li et al. | |
| 2005/0287466 A1 | 12/2005 | Miyamoto et al. | |
| 2006/0008736 A1 | 1/2006 | Kanda et al. | |
| 2006/0105267 A1 | 5/2006 | Khojasteh et al. | |
| 2006/0141400 A1 | 6/2006 | Hirayama et al. | |
| 2006/0204890 A1 | 9/2006 | Kodama | |
| 2006/0246373 A1 | 11/2006 | Wang | |
| 2006/0257781 A1 | 11/2006 | Benoit et al. | |
| 2006/0257785 A1 | 11/2006 | Johnson | |
| 2007/0031755 A1 | 2/2007 | Hirayama et al. | |
| 2007/0181947 A1 * | 8/2007 | Ching Ho Chan ... | H01L 21/845 |
| | | | 257/351 |
| 2007/0207406 A1 | 9/2007 | Guerrero et al. | |
| 2008/0113300 A2 | 5/2008 | Choi et al. | |
| 2008/0149135 A1 | 6/2008 | Cho et al. | |
| 2008/0160729 A1 | 7/2008 | Krueger et al. | |
| 2008/0187860 A1 | 8/2008 | Tsubaki et al. | |
| 2008/0241778 A1 | 10/2008 | Kulp | |
| 2008/0261384 A1 * | 10/2008 | Sun .............. | G03F 7/427 |
| | | | 438/514 |

(56) References Cited

U.S. PATENT DOCUMENTS

| | | | |
|---|---|---|---|
| 2008/0296648 A1* | 12/2008 | Zhu | H01L 21/845 257/300 |
| 2009/0042147 A1 | 2/2009 | Tsubaki | |
| 2009/0152600 A1* | 6/2009 | Raghavan | H01L 21/31133 257/288 |
| 2009/0305163 A1 | 12/2009 | Iwashita et al. | |
| 2009/0311623 A1* | 12/2009 | Kwinten | G03F 7/38 430/270.1 |
| 2009/0311624 A1 | 12/2009 | Horiguchi et al. | |
| 2010/0040971 A1 | 2/2010 | Tarutani et al. | |
| 2010/0239984 A1 | 9/2010 | Tsubaki | |
| 2011/0020755 A1 | 1/2011 | Tsubaki | |
| 2011/0097670 A1 | 4/2011 | Wang et al. | |
| 2011/0250543 A1 | 10/2011 | Tsubaki | |
| 2011/0262861 A1* | 10/2011 | Winkle | G03F 7/033 430/270.1 |
| 2011/0263136 A1 | 10/2011 | Kim et al. | |
| 2012/0006486 A1* | 1/2012 | Chebi | G03F 7/427 156/345.26 |
| 2012/0052687 A1* | 3/2012 | Raghavan | G03F 7/423 438/705 |
| 2012/0123047 A1* | 5/2012 | Szkudlarek | C08F 283/01 524/554 |
| 2012/0171616 A1 | 7/2012 | Thackeray et al. | |
| 2012/0238106 A1 | 9/2012 | Chuang | |
| 2012/0282553 A1 | 11/2012 | Kimura et al. | |
| 2012/0308741 A1 | 12/2012 | Kim et al. | |
| 2012/0308939 A1 | 12/2012 | Kudo et al. | |
| 2014/0011133 A1 | 1/2014 | Liu et al. | |
| 2015/0017791 A1* | 1/2015 | Ohashi | C08L 101/00 438/514 |

FOREIGN PATENT DOCUMENTS

| | | |
|---|---|---|
| TW | I336819 | 2/2011 |
| TW | I341961 | 5/2011 |
| TW | I1343513 | 6/2011 |
| WO | 2005088397 | 9/2005 |
| WO | 2006054432 | 5/2006 |

OTHER PUBLICATIONS

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of the Electromechanical Society, Jun. 10, 2011, 10 pages, vol. 158, Issue 8, The Electromechanical Society.

Wikipedia, The Free Encyclopedia, "Diels-Alder reaction," downloaded Dec. 20, 2013, 11 pages, Wikimedia Foundation, Inc., http://en.wikipedia.org/wiki/Diels-Alder_reaction, last accessed May 14, 2014.

Wikipedia, The Free Encyclopedia, "Organic acid anhydride," downloaded Jan. 21, 2014, 4 pages, Wikimedia Foundation, Inc., http://en.wikipedia.org/wiki/Anhydride, last accessed May 14, 2014.

Wikipedia, The Free Encyclopedia, "Piranha solution," downloaded Dec. 24, 2013, 4 pages, Wikimedia Foundation, Inc., http://en.wikipedia.org/wiki/Piranha_solution, last accessed May 14, 2014.

Wikipedia, The Free Encyclopedia, "Radical (chemistry)," downloaded Jan. 21, 2014, 10 pages, Wikimedia Foundation, Inc., http://en.wikipedia.org/wiki/Radical_(chemistry), last accessed May 14, 2014.

Wikipedia, The Free Encyclopedia, "TEMPO," downloaded Dec. 26, 2013, 3 pages, Wikimedia Foundation, Inc., http://en.wikipedia.org/wiki/TEMPO, last accessed May 14, 2014.

* cited by examiner

PHOTORESIST SYSTEM AND METHOD

BACKGROUND

As consumer devices have gotten smaller and smaller in response to consumer demand, the individual components of these devices have decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing have been utilized in order to keep up the ability to scale down the devices, and further improvements are needed in order to meet the desired design criteria such that the march towards smaller and smaller components may be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
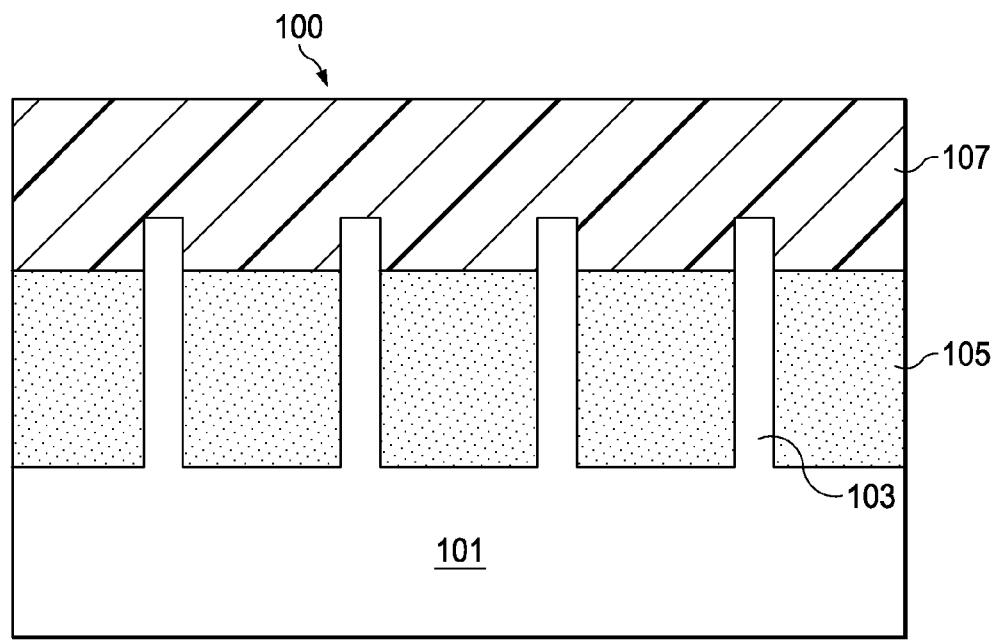
FIG. 1 illustrates a bottom anti-reflective coating and a photoresist over a substrate and fins in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a semiconductor device 100 that comprises a substrate 101 and fins 103 formed over the substrate 101 along with a bottom anti-reflective coating (BARC) layer 105 and photoresist 107 applied over the fins 103 and the substrate 101. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The fins 103 will serve as a fin structure for the eventual formation of FinFET or multiple gate transistors (not separately illustrated in FIG. 1). In an embodiment the fins 103 may be formed from polysilicon formed by initially depositing the polysilicon using, e.g., a chemical vapor deposition process. Once formed, the polysilicon may then be patterned by masking and etching the polysilicon to form the fins 103 over the substrate 101.

Alternatively, the fins 103 may be made from the material of the substrate 101 and, as such, may also comprise bulk silicon, doped or undoped, or be an active layer of a SOI substrate. The fins 103 may be formed by first applying a masking material over the substrate 101, patterning the masking material, and then using the masking material as a mask to etch into the substrate 101, thereby forming the fins 103 from the material of the substrate 101. The semiconductor device 100 may have an ordered active area and polysilicon pattern.

However, the above described processes are only illustrative methods that may be used to form the fins 103. Alternatively, the fins 103 may be formed by initially depositing a semiconductor material, such as silicon, silicon-germanium, or the like, over the substrate 101 and then masking and etching the semiconductor material to form the fins 103 over the substrate 101. In yet another alternative, the fins 103 may be formed by masking the substrate 101 and using, e.g., an epitaxial growth process to grow the fins 103 on the substrate 101. These, and any other suitable method for forming the fins 103 may alternatively be utilized, and all such methods are fully intended to be included within the scope of the embodiments.

The BARC layer 105 is applied over the fins 103 and fills a portion of the regions between the fins 103 in preparation for an application of the photoresist 107. The BARC layer 105, as its name suggests, works to prevent the uncontrolled and undesired reflection of energy (e.g., light) such as light back into the overlying photoresist 107 during an exposure of the photoresist 107, thereby preventing the reflecting light from causing reactions in an undesired region of the photoresist 107. Additionally, the BARC layer 105 may be used to provide a planar surface, helping to reduce the negative effects of the energy impinging at an angle.

In an embodiment the BARC layer 105 comprises a polymer resin, a catalyst, and a cross-linking agent, all of which are placed into a BARC solvent for dispersal. The polymer resin may comprise a polymer with various monomers bonded together. In an embodiment the polymer may comprise different monomers such as a cross-linking monomer and a monomer with chromophore units. In an embodiment, the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted acridine, substituted and unsubstituted quinolinyl and ring-substituted quinolinyls (e.g., hydroxyquinolinyl), substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur or combinations thereof, such as alkylenes, esters, ethers, combinations of these, or the like, with carbon atoms between 1 and 12.

In specific embodiments the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy) ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and prevent the light from being reflected may alternatively be used, and all such monomers are fully intended to be included within the scope of the embodiments.

The cross-linking monomer may be used to cross-link the monomer with other polymers within the polymer resin to modify the solubility of the BARC layer 105, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of these, and the like. Specific examples of cross-linking monomers that may be utilized include polyhydroxystyrene, poly(hydroxynaphthalene), poly(metha)crylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl(meth)acrylate, ethyl(meth)acrylate, (meth)acrylic acid, poly(hydroxystyrene-styrene-methacrylate), poly(hydroxystyrene-styrene-methacrylate), poly(4-hydroxystyrene), and poly(pyromellitic dianhydride-ethylene glycol-propylene oxide).

The various monomers will be polymerized with one another to form a polymer structure with a carbon chain backbone for the polymer resin. In an embodiment the polymer structure may have a carbon chain backbone that is an acrylic, a polyester, an epoxy novalac, a polysaccharide, a polyether, a polyimide, a polyurethane, and mixtures thereof. One example of a particular polymer resin that may be utilized has the following structure:

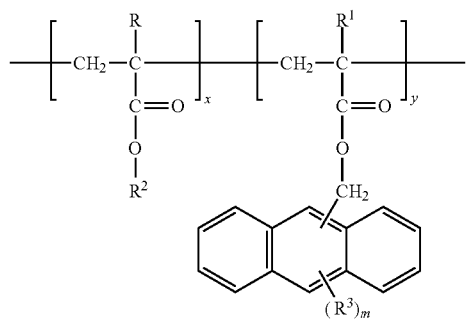

where each R and $R^1$ may be a hydrogen or a substituted or unsubstituted alkyl group having from 1 to 8 carbon atoms; each $R^2$ may be a substituted or unsubstituted alkyl having from 1 to 10 carbon atoms; and each $R^3$ may be a halogen atom, an alkyl having from 1 to 8 carbon atoms, an alkoxy having between 1 to 8 carbon atoms, an alkenyl having between 2 to 8 carbon atoms, an alkynyl having from 2 to 8 carbon atoms, cyano, nitro; m is an integer of from 0 to 9; and x is the mole fraction of percent of alkyl units in the polymer resin and is between about 10% and about 80%; and y is the mole fraction or percent of anthracene units in the polymer resin and is between about 5% and about 90%.

Additionally, as one of ordinary skill in the art will recognize, the above description for the various monomers that may be polymerized to form the polymer resin for the BARC layer 105 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

The catalyst may be a compound that is used to initiate a cross-linking reaction between the polymers within the polymer resin, and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the BARC layer 105. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide flating catalystsulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In other embodiment the catalyst may be a photobase generator. In such an embodiment the photobase generator may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

The cross-linking agent may also be added to the BARC layer 105. The cross-linking agent reacts with the polymers within the BARC layer 105 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bis-methoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

The individual components of the BARC layer 105 may be placed into the BARC solvent in order to aid in the mixing and placement of the BARC layer 105. To aid in the mixing and placement of the BARC layer 105, the solvent is chosen at least in part based upon the materials and monomers chosen for the polymer resin of the BARC layer 105 as well as the catalyst. In particular, the BARC solvent is chosen such that the polymer resin, the catalysts, and the cross-linking agent can be evenly dissolved into the BARC solvent and dispensed upon the substrate 101 and the fins 103.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the BARC layer 105 are merely illustrative and are not intended to limit the embodiments. Rather, any suitable material that may dissolve the polymer resin, the catalyst, and the cross-linking layer may alternatively be utilized to help mix and apply the BARC layer 105. All such materials are fully intended to be included within the scope of the embodiments.

Additionally, other components may also be added into the material for the BARC layer 105 if desired. For example, in an embodiment monomeric dyes, surface leveling agents, adhesion promoters, anti-foaming agent, and the like, may alternatively be utilized. Any suitable additive may be added into the material for the BARC layer 105, and all such additives are fully intended to be included within the scope of the embodiments.

In an embodiment the polymer resin, the catalysts, and the cross-linking agent, along with any desired additives or other agents, are added to the BARC solvent to form the material for the BARC layer 105. Once added, the mixture is then mixed in order to achieve an even and constant composition throughout the material for the BARC layer 105 in order to ensure that there are no defects caused by an uneven mixing or non-constant composition of the material for the BARC layer 105. Once mixed together, the material for the BARC layer 105 may either be stored prior to its usage or else used immediately.

In its original mixed form, the material for the BARC layer 105 may comprise a constant composition of components, with the polymer resin having a concentration of between about 0.1% and about 60%, the catalyst having a concentration of between about 0.01% and about 10%, and the cross-linking agent having a concentration of between about 0.01% and about 30%. However, while these concentrations are illustrative, any suitable combinations of the various components of the material for the BARC layer 105 may be used, and all such combinations are fully intended to be included within the scope of the embodiments.

Once the material for the BARC layer 105 has been prepared, the material for the BARC layer 105 may be utilized by initially applying the material for the BARC layer 105 onto the substrate 101 and the fins 103. The material for the BARC layer 105 may be applied to the substrate 101 and the fins 103 so that the material for the BARC layer 105 coats an upper exposed surface of the substrate 101 and at least partially, if not completely, fills in a region between the fins 103, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 105 may be initially applied such that it has a constant concentration and has a thickness over a top of the substrate 101 of between about 10 nm and about 1000 nm, such as about 100 nm.

Once the material for the BARC layer 105 is in place, a pre-bake of the BARC layer 105 may be performed. In an embodiment once the BARC layer 105 has been applied to the substrate 101 and the fins 103, the pre-bake of the BARC layer 105 is performed in order to cure and dry the BARC layer 105 prior to an application of the photoresist 107. The curing and drying of the BARC layer 105 removes a portion of the BARC solvent components but leaves behind the polymer resin, the catalysts, the cross-linking agent, and other additives. In an embodiment the pre-bake may be performed at a temperature suitable to evaporate the BARC solvent, such as between about 40° C. and 150° C., although the precise temperature depends upon the materials chosen for the BARC layer 105. The pre-bake is performed for a time sufficient to cure and dry the BARC layer 105, such as between about 10 seconds to about 5 minutes, such as about 90 seconds.

In an embodiment the photoresist 107 includes a photoresist polymer resin along with one or more photoactive compounds (PACs) in a photoresist solvent. In an embodiment the photoresist polymer resin may comprise a hydrocarbon structure (such as an alicyclic hydrocarbon structure) that contains one or more groups that will decompose (e.g., an acid labile group) or otherwise react when mixed with acids, bases, or free radicals generated by the PACs (as further described below with respect to FIG. 2). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth) acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxyl)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxyl)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is an photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 107 has been developed, thereby helping to reduce the number of defects that occur during development. In an embodiment the lactone groups may include rings having five to seven members, although any suitable lactone structure may alternatively be used for the lactone group.

The photoresist polymer resin may also comprise groups that can assist in increasing the adhesiveness of the photoresist 107 to underlying structures (e.g., the BARC layer 105 and/or the fins 103). In an embodiment polar groups may be used to help increase the adhesiveness, and polar groups that may be used in this embodiment include hydroxyl groups, cyano groups, or the like, although any suitable polar group may alternatively be utilized.

Optionally, the photoresist polymer resin may further comprise one or more alicyclic hydrocarbon structures that do not also contain a group which will decompose. In an embodiment the hydrocarbon structure that does not contain a group which will decompose may includes structures such as 1-adamantyl(meth)acrylate, tricyclodecanyl(meth)acrylate, cyclohexyl(methacrylate), combinations of these, or the like.

Additionally, the photoresist 107 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenyleether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethyl-ene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

Additionally to the photoresist polymer resin and the PACs, the photoresist 107 may also contain a radical inhibitor in order to inhibit cross-linking during subsequent processes such as an ion implantation process 501 (not illustrated in FIG. 1 but illustrated and described below with respect to FIG. 5). In an embodiment the radical inhibitor may be, e.g., a persistent radical, which is a radical that has a relatively longer longevity in which it does not immediately react. This longevity is achieved by steric crowding around the center of the persistent radical, thereby helping to physically block the radical from reacting with other reagents. Such radicals may be stabilized by an electron-donating group, an electron-withdrawing group or a conjugating group. In an embodiment the radical inhibitor may have a concentration of between about 0% and about 20%, such as about 10%.

In an embodiment the radical inhibitor is a persistent radical such as 2,2,6,6,-tetramethylpiperidinyloxy, (2,2,6,6-tetramethylpiperidin-1-yl)oxy or (2,2,6,6-tetramethylpiperidin-1-yl)oxidanyl (TEMPO), 4-hydroxy-2,2,6,6-tetramethylpiperidin-1-oxyl (TEMPOL), potassium nitrosodisulfonate ($(KSO_3)_2NO$), nitroxides ($R_2NO$), nitronyl nitroxides, azephenylenyls derived from perchlorophenylmethyl radicals, tris(2,4,6-trichlorophenyl)methyl radicals (TTM), combinations of these, or the like. However, any suitable persistent radical may alternatively be utilized.

In particular embodiments the radical inhibitor may comprise one of the following structures:

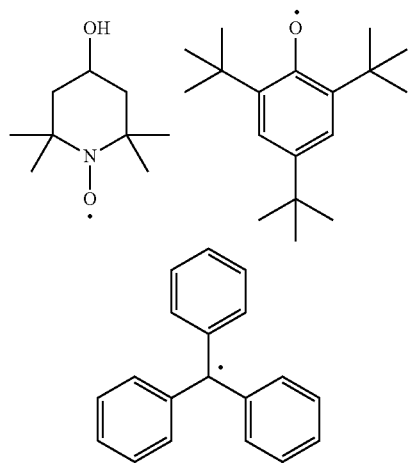

Alternatively, instead of using a persistent radical, the radical inhibitor may be an anhydride material, which may also be used to increase the solubility of materials in polar solvents during wet processes because of the hydrolysis of the anhydrides. In an embodiment the anhydride material may be a dehydration product of a dicarboxylic acid which can be hydrolyzed in the presence of water, such as maleic anhydride. In a particular embodiment in which the anhydride material is maleic anhydride, which has the following structure:

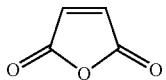

However, other suitable anhydrides, such as anhydrides with a carbon-carbon double bond between two carbonyl groups, or molecules that that have two moieties with one unsaturated carbon-carbon bond and one anhydride, may alternatively be utilized. All such anhydrides that include a carbon-carbon double bond to react with the radicals generated from the implantation process and inhibit the polymerization may also be used, and all such radical inhibitors are fully intended to be included within the scope of the embodiments.

However, as one of ordinary skill in the art will recognize, the precise radical inhibitors discussed above are intended to be illustrative only and are not intended to be limiting upon the embodiments. Rather, any suitable reagent that will inhibit the radicals formed during a process (e.g., the ion implantation process described below with respect to FIG. 5) from cross-linking may alternatively, be used. All such radical inhibitors are fully intended to be included within the scope of the embodiments.

The individual components of the photoresist 107 may be placed into the photoresist solvent in order to aid in the mixing and placement of the photoresist 107. To aid in the mixing and placement of the photoresist 107, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the BARC layer 105.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 107 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 107 are merely illustrative and are not intended to limit the embodiments. Rather, any suitable material that may dissolve the photoresist polymer resin and the PACs may alternatively be utilized to help mix and apply the photoresist 107. All such materials are fully intended to be included within the scope of the embodiments.

Additionally, while individual ones of the above described materials may be used as the photoresist solvent for the photoresist 107, in alternative embodiments more than one of the above described materials may be utilized. For example, the photoresist solvent may comprise a combination mixture of two or more of the materials described. All such combinations are fully intended to be included within the scope of the embodiments.

Optionally, a photoresist cross-linking agent may also be added to the photoresist 107. The photoresist cross-linking agent reacts with the photoresist polymer resin within the photoresist 107 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetramethoxymethylated glycoluril, mono-, di-, tri-, and/or tetraethoxymethylated glycoluril, mono-, di-, tri-, and/or tetrapropoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resins, the PACs, the radical inhibitors, the photoresist solvents, and the photoresist cross-linking agents, the photoresist 107 may also include a number of other additives that will assist the photoresist 107 obtain the highest resolution. For example, the photoresist 107 may also include surfactants in order to help improve the ability of the photoresist 107 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Another additive that may be added to the photoresist 107 is a quencher, which may be utilized to inhibit diffusion of the generated acids/bases/free radicals within the photoresist, which helps the resist pattern configuration as well as to improve the stability of the photoresist 107 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 107 is a stabilizer, which assists in preventing undesired diffusion of the acids generated during exposure of the photoresist 107. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 107 may be a dissolution inhibitor in order to help control dissolution of the photoresist 107 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 107 may be a plasticizer. Plasticizers may be used to reduce delamination and cracking between the photoresist 107 and underlying layers (e.g., the BARC layer 105 and/or the fins 103) and may comprise monomeric, loigomeric, and polymeric plasticizers such as oligo-anpolyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 107 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, crystal violet, titanium oxide, carbon black, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 107 in order to promote adhesion between the photoresist 107 and an underlying layer upon which the photoresist 107 has been applied (e.g., the BARC layer 105 and/or the fins 103). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxpteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 107 in order to assist a top surface of the photoresist 107 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the photoresist polymer resin, the PACs, the radical inhibitors, along with any desired additives or other agents, are added to the photoresist solvent for application. Once added, the mixture is then mixed in order to achieve an even composition throughout the photoresist 107 in order to ensure that there are no defects caused by an uneven mixing or non-constant composition of the photoresist 107. Once mixed together, the photoresist 107 may either be stored prior to its usage or else used immediately.

Once ready, the photoresist 107 may be utilized by initially applying the photoresist 107 onto the BARC layer 105 and/or the fins 103. The photoresist 107 may be applied to the BARC layer 105 and/or the fins 103 so that the photoresist 107 coats an upper exposed surface of the BARC layer 105 and/or the fins 103, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 107 may be applied such that it has a thickness over the surface of the BARC layer 105 of between about 10 nm and about 300 nm, such as about 150 nm.

Once the photoresist 107 has been applied to the semiconductor substrate, a pre-bake of the photoresist 107 is performed in order to cure and dry the photoresist 107 prior to exposure to finish the application of the photoresist 107.

The curing and drying of the photoresist 107 removes the photoresist solvent component while leaving behind the photoresist polymer resin, the PACs, the radical inhibitors, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 107. The pre-bake is performed for a time sufficient to cure and dry the photoresist 107, such as between about 10 seconds to about 5 minutes, such as about 90 seconds.

Figure 2:
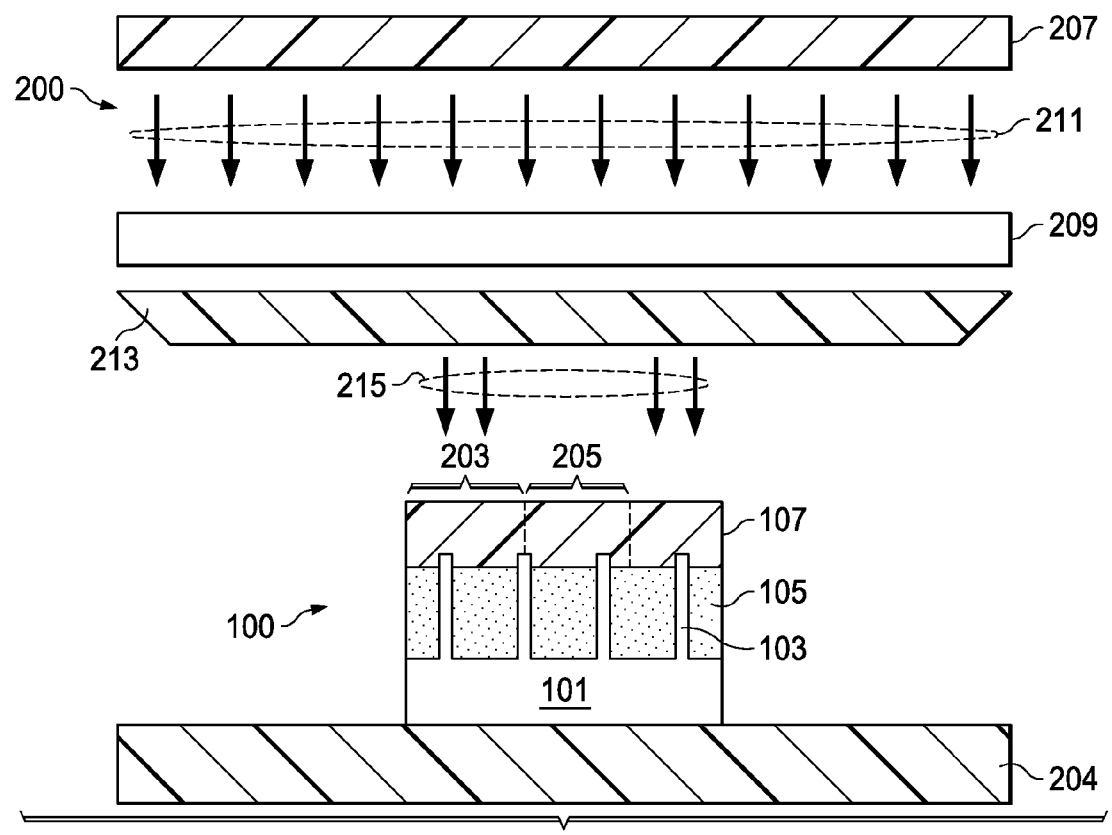
FIG. 2 illustrates an exposure of the photoresist in accordance with some embodiments.

FIG. 2 illustrates an exposure of the photoresist 107 using, e.g., a photoresist imaging device 200. The photoresist imaging device 200 may comprise a photoresist support plate 204, a photoresist energy source 207, a patterned mask 209 between the photoresist support plate 204 and the photoresist energy source 207, and photoresist optics 213. In an embodiment the photoresist support plate 204 is a surface to which the semiconductor device 100 and the photoresist 107 may be placed or attached to and which provides support and control to the substrate 101 during exposure of the photoresist 107. Additionally, the photoresist support plate 204 may be movable along one or more axes, as well as providing any desired heating or cooling to the substrate 101 and photoresist 107 in order to prevent temperature gradients from affecting the exposure process.

In an embodiment the photoresist energy source 207 supplies photoresist energy 211 such as light to the photoresist 107 in order to induce a reaction of the PACs, which in turn reacts with the photoresist polymer resin to chemically alter those portions of the photoresist 107 to which the photoresist energy 211 impinges. In an embodiment the photoresist energy 211 may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source 207 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of photoresist energy 211, such as mercury vapor lamps, xenon lamps, carbon arc lamps or the like, may alternatively be utilized.

The patterned mask 209 is located between the photoresist energy source 207 and the photoresist 107 in order to block portions of the photoresist energy 211 to form a patterned energy 215 prior to the photoresist energy 211 actually impinging upon the photoresist 107. In an embodiment the patterned mask 209 may comprise a series of layers (e.g., substrate, absorbance layers, anti-reflective coating layers, shielding layers, etc.) to reflect, absorb, or otherwise block portions of the photoresist energy 211 from reaching those portions of the photoresist 107 which are not desired to be illuminated. The desired pattern may be formed in the patterned mask 209 by forming openings through the patterned mask 209 in the desired shape of illumination.

Optics (represented in FIG. 2 by the trapezoid labeled 213) may be used to concentrate, expand, reflect, or otherwise control the photoresist energy 211 as it leaves the photoresist energy source 207, is patterned by the patterned mask 209, and is directed towards the photoresist 107. In an embodiment the photoresist optics 213 comprise one or more lenses, mirrors, filters, combinations of these, or the like to control the photoresist energy 211 along its path. Additionally, while the photoresist optics 213 are illustrated in FIG. 2 as being between the patterned mask 209 and the photoresist 107, elements of the photoresist optics 213 (e.g., individual lenses, mirrors, etc.) may also be located at any location between the photoresist energy source 207 (where the photoresist energy 211 is generated) and the photoresist 107.

In an embodiment the semiconductor device 100 with the photoresist 107 is placed on the photoresist support plate 204. Once the pattern has been aligned to the semiconductor device 100, the photoresist energy source 207 generates the desired photoresist energy 211 (e.g., light) which passes through the patterned mask 209 and the photoresist optics 213 on its way to the photoresist 107. The patterned energy 215 impinging upon portions of the photoresist 107 induces a reaction of the PACs within the photoresist 107. The chemical reaction products of the PACs' absorption of the patterned energy 215 (e.g., acids/bases/free radicals) then reacts with the photoresist polymer resin, chemically altering the photoresist 107 in those portions that were illuminated through the patterned mask 209, thereby forming an exposed region 203 and an unexposed region 205.

In a specific example in which the patterned energy 215 is a 193 nm wavelength of light, the PAC is a photoacid generator, and the group to be decomposed is a carboxylic acid group on the hydrocarbon structure and a cross linking agent is used, the patterned energy 215 will impinge upon the photoacid generator and the photoacid generator will absorb the impinging patterned energy 215. This absorption initiates the photoacid generator to generate a proton (e.g., a H+ atom) within the photoresist 107. When the proton impacts the group to be decomposed, on the hydrocarbon structure, the proton will react with the group to be decomposed, chemically altering the group to be decomposed and altering the properties of the photoresist polymer resin in general. The products from the group to be decomposed reaction with the protons will then react with the photoresist cross-linking agent to cross-link with other photoresist polymer resins within the photoresist 107.

Optionally, the exposure of the photoresist 107 may occur using an immersion lithography technique. In such a technique an immersion medium (not individually illustrated in FIG. 2) may be placed between the photoresist imaging device 200 (and particularly between a final lens of the photoresist optics 213) and the photoresist 107. With this immersion medium in place, the photoresist 107 may be patterned with the patterned energy 215 passing through the immersion medium.

In this embodiment a protective layer (also not individually illustrated in FIG. 2) may be formed over the photoresist 107 in order to prevent the immersion medium from coming into direct contact with the photoresist 107 and leaching or otherwise adversely affecting the photoresist 107. In an embodiment the protective layer is insoluble within the immersion medium such that the immersion medium will not dissolve it and is immiscible in the photoresist 107 such that the protective layer will not adversely affect the photoresist 107. Additionally, the protective layer is transparent so that the patterned energy 215 may pass through the protective layer without hindrance.

In an embodiment the protective layer comprises a protective layer resin within a protective layer solvent. The material used for the protective layer solvent is, at least in part, dependent upon the components chosen for the photoresist 107, as the protective layer solvent should not dissolve the materials of the photoresist 107 so as to avoid degradation of the photoresist 107 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 107, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 107, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 107. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 107 may be applied such that it has a thickness over the surface of the photoresist 107 of about 100 nm.

After the protective layer composition has been applied to the photoresist 107, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 107, the semiconductor device 100 with the photoresist 107 and the protective layer are placed on the photoresist support plate 204, and the immersion medium may be placed between the protective layer and the photoresist optics 213. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the photoresist optics 213 may be done using, e.g., an air knife method, whereby fresh immersion medium is applied to a region between the protective layer and the photoresist optics 213 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 107 may be exposed using an immersion method. Any other suitable method for imaging the photoresist 107 using an immersion medium, such as immersing the entire substrate 101 along with the photoresist 107 and the protective layer, using solid barriers instead of gaseous barriers, or using an immersion medium without a protective layer, may also be utilized. Any suitable method for exposing the photoresist 107 through the immersion medium may be used, and all such methods are fully intended to be included within the scope of the embodiments.

After the photoresist 107 has been exposed to the patterned energy 215, a post-exposure baking may be used in order to assist in the generating, dispersing, and reacting of the acid/base/free radical generated from the impingement of the patterned energy 215 upon the PACs during the exposure. Such assistance helps to create or enhance chemical reactions which generate chemical differences between the exposed region 203 and the unexposed region 205 within the photoresist 107. These chemical differences also caused differences in the solubility between the exposed region 203 and the unexposed region 205. In an embodiment this post-exposure baking may occur at temperatures of between about 50° C. and about 160° C. for a period of between about 40 seconds and about 120 seconds.

Figure 3:
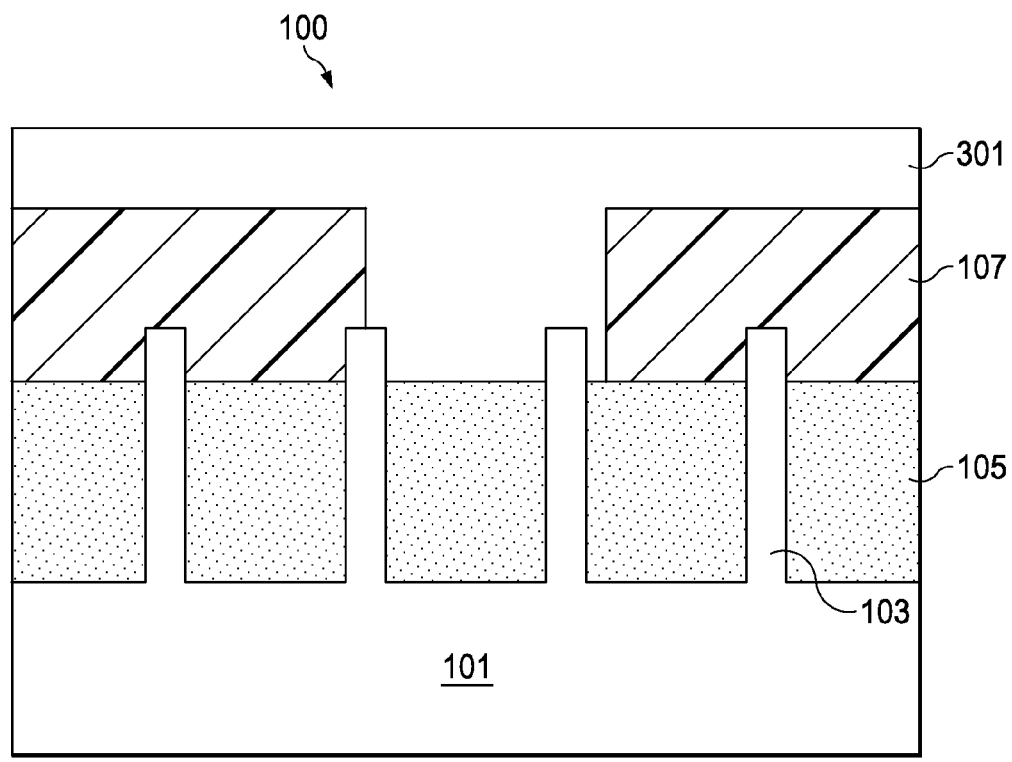
FIG. 3 illustrates a development of the photoresist in accordance with some embodiments.

FIG. 3 illustrates a development of the photoresist 107 with the use of a developer 301 after the photoresist 107 has been exposed. After the photoresist 107 has been exposed and the post-exposure baking has occurred, the photoresist 107 may be developed using either a positive tone developer or a negative tone developer, depending upon the desired pattern for the photoresist 107. In an embodiment in which the exposed region 203 of the photoresist 107 is desired to be removed to form a positive tone, a positive tone developer such as a basic aqueous solution may be utilized to remove those portions of the photoresist 107 which were exposed to the patterned energy 215 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

If a negative tone development is desired, an organic solvent or critical fluid may be utilized to remove those portions of the photoresist 107 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 107 that has a different property (e.g., solubility) than another portion of the photoresist 107, may alternatively be utilized, and all such developers are fully intended to be included within the scope of the embodiments.

In an embodiment in which immersion lithography is utilized to expose the photoresist 107 and a protective layer is utilized to protect the photoresist 107 from the immersion medium, the developer 301 may be chosen to remove not only those portions of the photoresist 107 that are desired to be removed, but may also be chosen to remove the protective layer in the same development step. Alternatively, the protective layer may be removed in a separate process, such as by a separate solvent from the developer 301 or even an etching process to remove the protective layer from the photoresist 107 prior to development.

FIG. 3 illustrates an application of the developer 301 to the photoresist 107 using, e.g., a spin-on process. In this process the developer 301 is applied to the photoresist 107 from above the photoresist 107 while the semiconductor device 100 (and the photoresist 107) is rotated. In an embodiment the developer 301 may be supplied at a flow rate of between about 300 mL/min and about 1000 mL/min, such as about 500 mL/min, while the semiconductor device 100 is being rotated at a speed of between about 500 rpm and about 2500 rpm, such as about 1500 rpm. In an embodiment the developer 301 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 107 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

FIG. 3 also illustrates a cross-section of the development process in an embodiment in which a negative tone developer is used to remove the unexposed region 205 of the photoresist 107. As illustrated, the developer 301 is applied to the photoresist 107 and dissolves the unexposed region 205 of the photoresist 107. This dissolving and removing of the unexposed region 205 of the photoresist 107 leaves behind an opening within the photoresist 107 that patterns the photoresist 107 in the shape of the patterned energy 215, thereby transferring the pattern of the patterned mask 209 to the photoresist 107.

Figure 4:
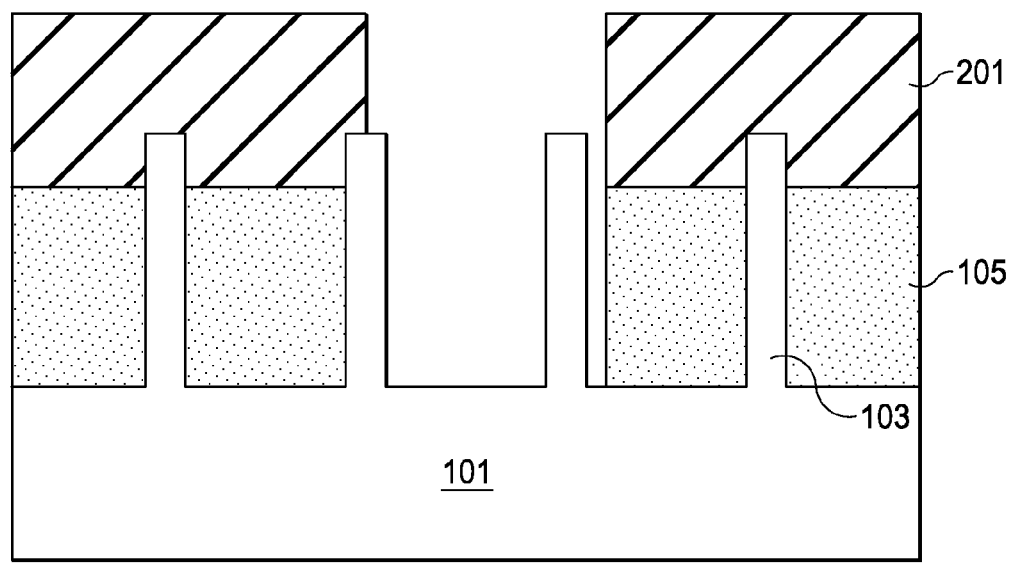
FIG. 4 illustrates a removal of a portion of the bottom anti-reflective coating through the photoresist in accordance with some embodiments.

FIG. 4 illustrates that once the photoresist 107 has been patterned, the pattern may be transferred to the BARC layer 105. In an embodiment in which the BARC layer 105 remains insoluble to the developer 301, the BARC layer 105 may be removed using an etching process that utilizes the photoresist 107 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

Alternatively, in an embodiment in which the BARC layer 105 comprises an acid labile group that can react to de-crosslink the cross-linked polymers in the BARC layer 105 and change the solubility of the BARC layer 105, the BARC layer 105 may be patterned during the development process by the developer 301. In particular, during exposure the photoacid generators may generate an acid in the BARC layer 105, which will work to break the cross-linking bonds and change the solubility of the BARC layer 105. Then, in a positive tone development process, a positive tone developer may be used to remove both the photoresist 107 that had been exposed as well as to remove the BARC layer 105 in the same process. Any suitable patterning process, with any suitable number of steps, may be utilized to pattern and remove both the photoresist 107 and the BARC layer 105, and all such processes and steps are fully intended to be included within the scope of the embodiments.

Figure 5:
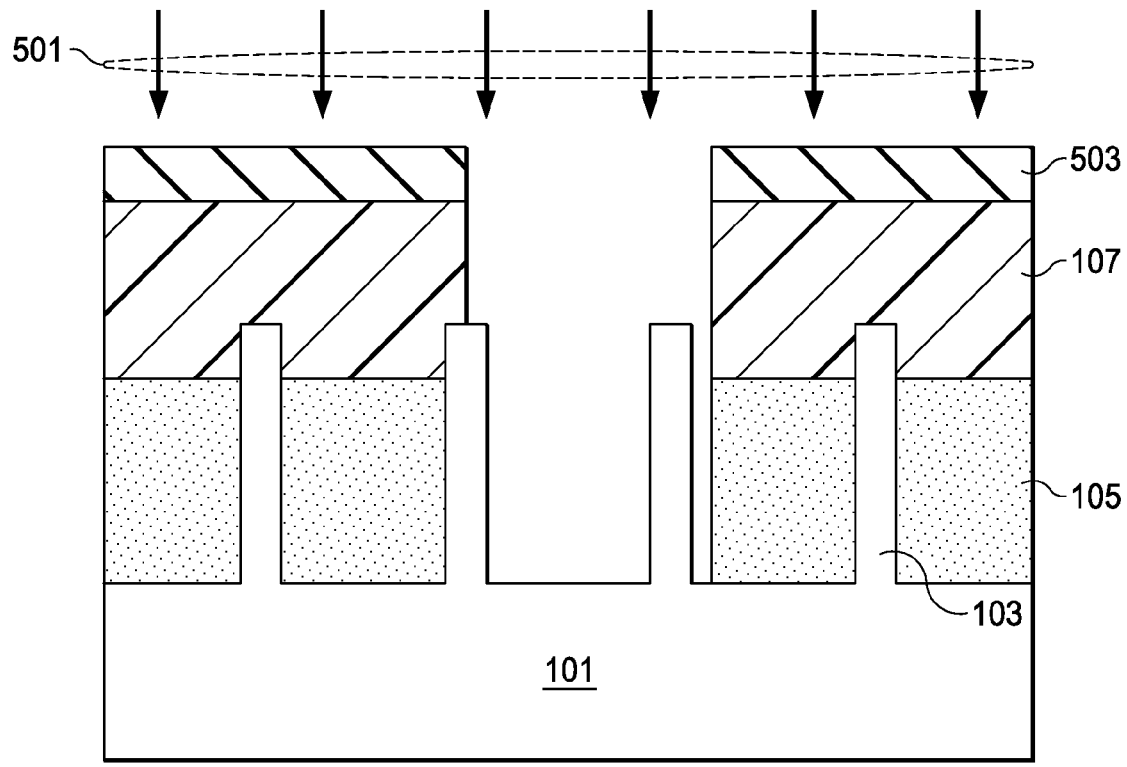
FIG. 5 illustrates an ion implantation with the photoresist as a mask in accordance with some embodiments.

FIG. 5 illustrates an embodiment in which the photoresist 107 and the BARC layer 105 are utilized as masks during, e.g., an ion implantation process (represented in FIG. 5 by the arrows labeled 501). In such an embodiment ions such as dopants are implanted into the fins 103 in order to form various conductive regions such as source/drain regions within the fins 103 to help form, e.g., a finFET device (not fully illustrated but which would also utilize a gate dielectric and gate electrode deposited and patterned over the fins 103 in order to form multiple gate transistors).

In an embodiment the ion implantation process 501 may be performed in multiple steps using the photoresist 107 and the BARC layer 105 as masking layers, and implants either n-type dopants (e.g., phosphorous, arsenic, antimony, or the like), or p-type dopants (e.g., $BF_2$, boron, aluminum, indium, or the like). However, any other suitable ions, such as boron ions or fluorine ions, which may be suitable for adjusting the properties of the to-be formed finFET transistor, may alternatively be utilized. Further, while the exact parameters for the ion implantation process 501 are dependent at least in part upon the desired features of the completed device, the ion implantation process 501 may be performed at an implantation power of between about 10 KeV and about 50 KeV, such as about 20 KeV. Further, the additional implantation step 201 is utilized to form a concentration in the fins 103 of between about $10^{11}$ atom/cm$^3$ and about $10^{17}$ atom/cm$^3$, such as about $10^{13}$ atom/cm$^3$.

FIG. 5 also illustrates that, during the ion implantation process 501, the ions will not only be implanted into the fins 103, but will also be implanted into the photoresist 107. This introduction of reactive ions into the photoresist 107 by the ion implantation process 501 will cause the material of the photoresist 107 impinged by the ions to perform an additional cross-linking reaction. However, this additional cross-linking reaction will not be uniform throughout the photoresist 107 because the ion absorption is not uniform throughout the photoresist 107. Rather, the additional cross-linking is relatively closer to a top surface of the photoresist 107, and will form a crust 503 within a top region of the photoresist 107, wherein the crust is a region of the photoresist 107 that has a different property than the remainder of the photoresist 107, such as by having a greater density of the cross-linked polymers.

In an effort to limit and reduce the formation of the crust 503, the radical inhibitors are added to the photoresist 107 as described above with respect to the photoresist 107 in FIG. 1. With the radical inhibitors in place within the photoresist 107 during the ion implantation process 501, the radical inhibitors will react with the polymers in place of the polymers cross-linking with each other. This reaction works to limit the additional cross-linking caused by the ion implantation process 501, thereby reducing the crust 503.

Figure 6A:
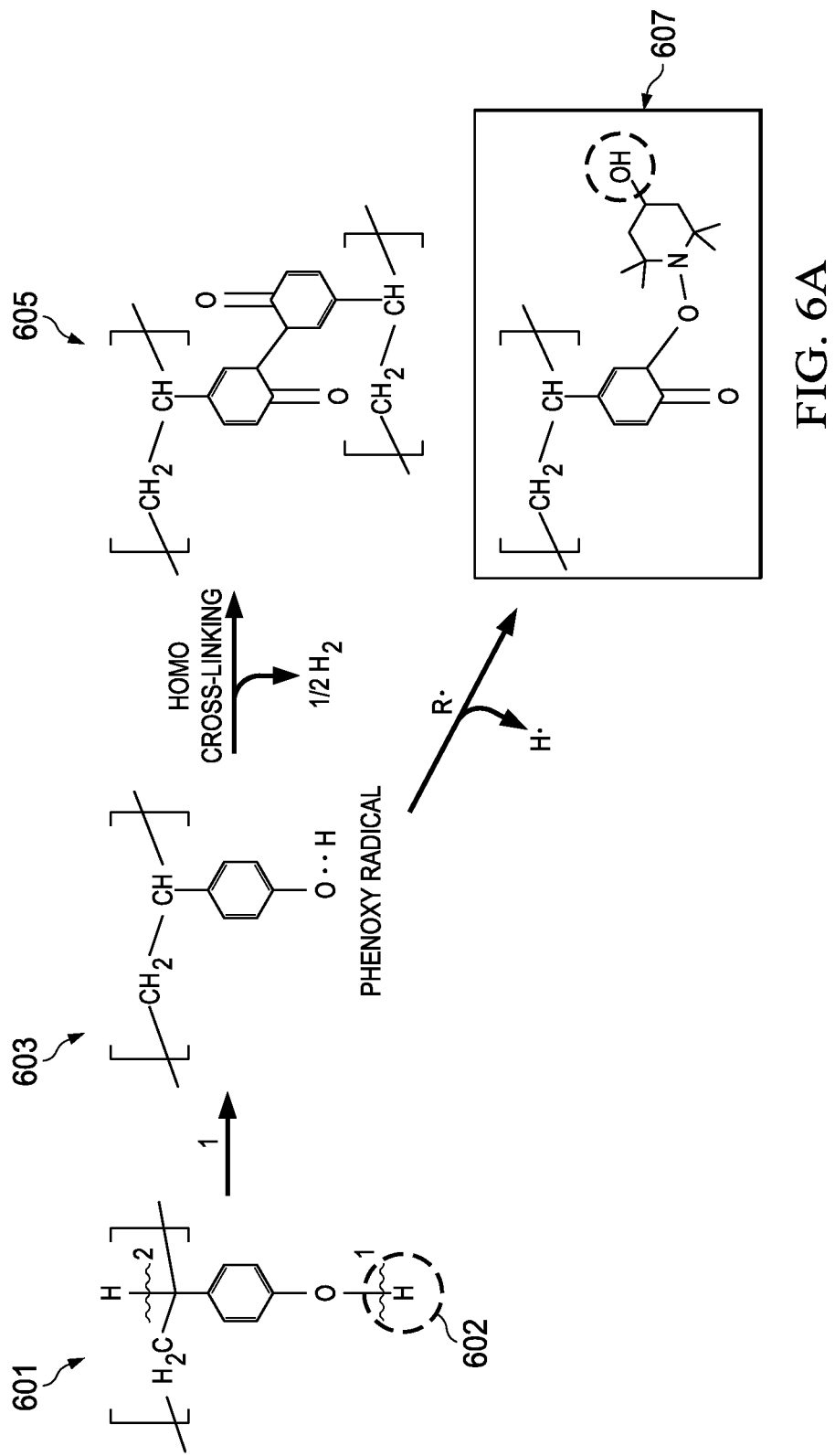
FIGS. 6A-6B illustrate possible chemical reaction mechanisms of the radical inhibitor in accordance with some embodiments.

FIG. 6A illustrates one possible chemical reaction mechanism by which the radical inhibitor will reduce the additional cross-linking of the photoresist 107 to from the crust 503. In this figure, 4-hydroxy-2,2,6,6-tetramethylpiperidinyloxy is used as the radical inhibitor, and it begins with a monomer of the photoresist polymer resin 601 having a first hydrogen atom 602 (attached to the oxygen atom on the benzene ring) being cleaved from the rest of the monomer during the ion implantation process 501, forming a phenoxy radical 603. Without the radical inhibitor present, all of the phenoxy radicals 603 that are generated would either rebond with another $H_2$ (represented in FIG. 6A by the ½ $H_2$ arrow) or else bond with a similar phenoxy radical from another monomer to form a undesired first cross-linked monomer 605.

However, with the presence of the radical inhibitor (represented in FIG. 6A by the label R•), at least some of the phenoxy radicals 603 will not bond with other phenoxy radicals 603 but will, instead, bond with the radical inhibitor R•, e.g., the 4-hydroxy-2,2,6,6-tetramethylpiperidinyloxy to form a first product 607 that has the 4-hydroxy-2,2,6,6-tetramethylpiperidinyloxy bonded to the hydrocarbon ring of the monomer. As such, the phenoxy radical is no longer available to cross-link with other monomers, and the amount of cross-linking is reduced. By reducing the cross-linking, the overall amount of the crust 503 may be reduced.

Figure 6B:
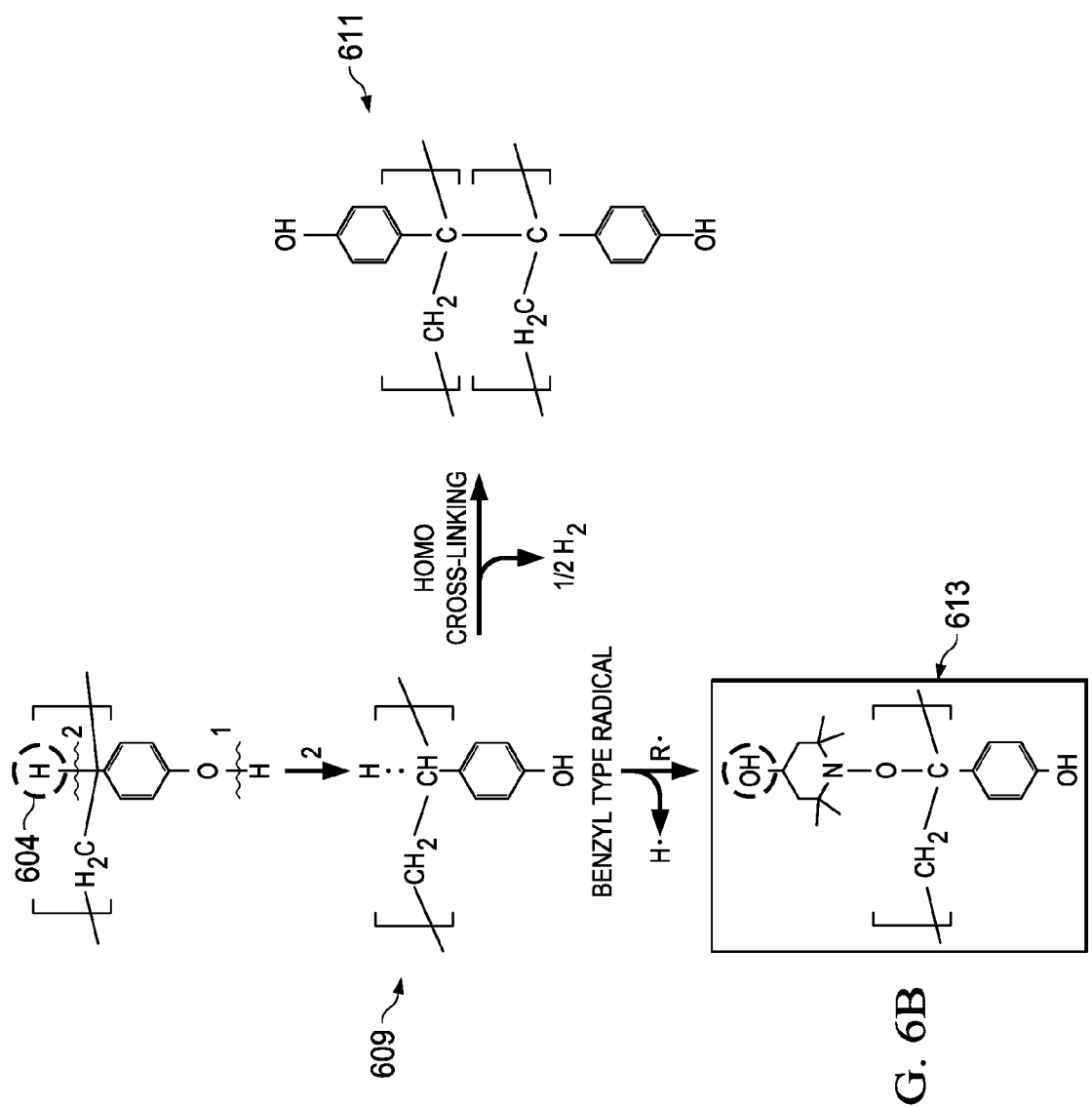

FIG. 6B illustrates another possible reaction mechanism whereby, instead of the first hydrogen atom 602 being cleaved from the oxygen on the benzene ring, a second hydrogen atom 604 bonded to the hydrocarbon backbone is cleaved to form a benzyl type radical 609. In this embodiment, with the removal of the hydrogen from the hydrocarbon backbone, without the radical inhibitor all of the benzyl type radicals 609 that are generated would either rebond with another $H_2$ (represented in FIG. 6B by the ½ $H_2$ arrow) or else bond with a similar benzyl type radical from another monomer to form a undesired second cross-linked monomer 611.

However, with the presence of the radical inhibitor (represented in FIG. 6B by the label R•), at least some of the benzyl type radicals 609 will not bond with other benzyl type radicals 609 but will, instead, bond with the radical inhibitor R•, e.g., the 4-hydroxy-2,2,6,6-tetramethylpiperidinyloxy to form a second product 613 that has the 4-hydroxy-2,2,6,6-tetramethylpiperidinyloxy bonded to the hydrocarbon backbone. As such, the benzyl type radical 609 is no longer available to cross-link with other monomers, and the amount of cross-linking is reduced. By reducing the cross-linking, the overall amount of the crust 503 may be reduced.

Additionally, as one of ordinary skill will recognize, the embodiments described above with respect to the chemical reaction mechanisms of FIGS. 6A and 6B are not exclusive of each other. Rather, these figures illustrate separate mechanisms that proceed along different paths, which paths may occur simultaneously to separate monomers. For example, a first monomer within the photoresist 107 may react as illustrated in FIG. 6A, while a second monomer within the photoresist 107 may simultaneously or nearly simultaneously react as illustrated in FIG. 6B. All such combinations of mechanisms are fully intended to be included within the scope of the embodiments.

Figure 7B:
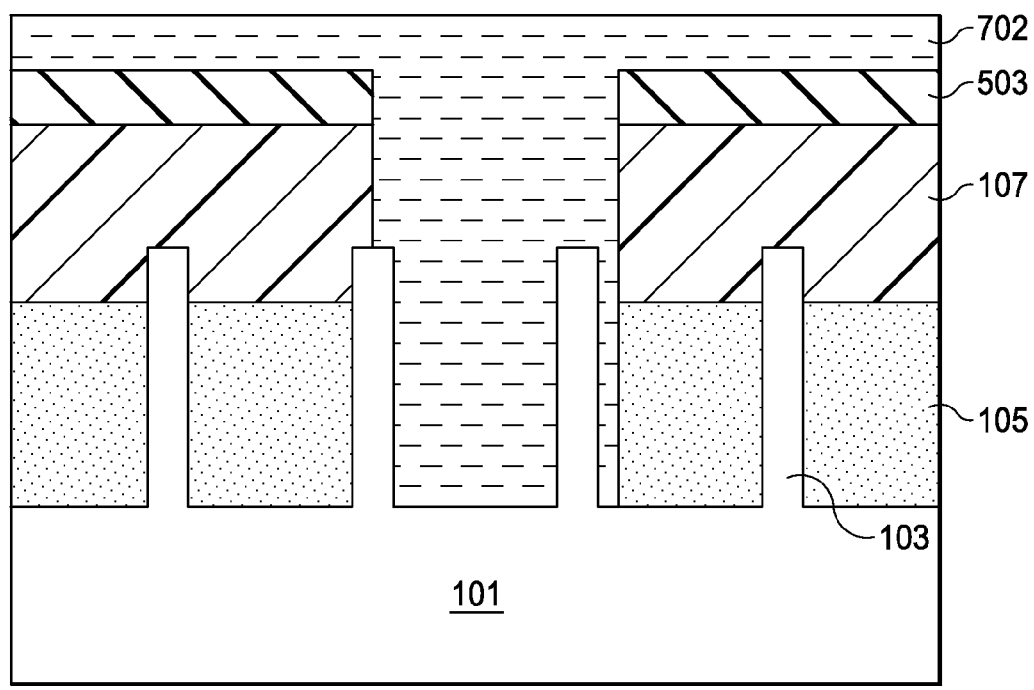
FIGS. 7A-7C illustrate possible chemical reaction mechanisms of the radical inhibitor along with a water treatment in accordance with some embodiments.
Figure 7A:
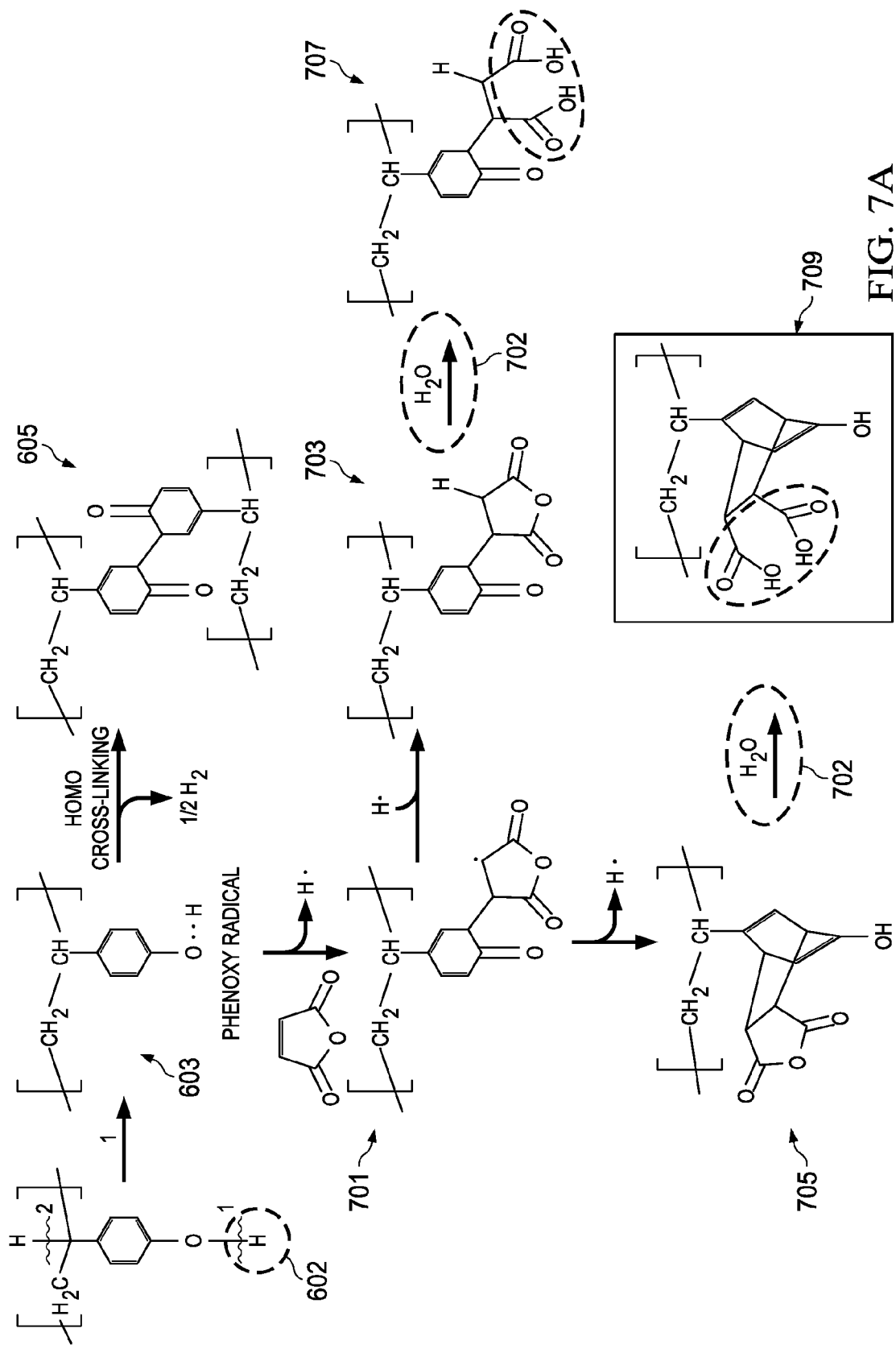

FIGS. 7A-7B illustrate possible reaction mechanisms for another embodiment in which maleic anhydride is utilized as the radical inhibitor. In this embodiment, the ion implantation process 501 again cleaves the first hydrogen atom 602 from the oxygen attached to the benzene ring to form the phenoxy radical 603. Without the radical inhibitor present, all of the phenoxy radicals 603 that are generated would either rebond with another $H_2$ (represented in FIG. 7A by the ½ H₂ arrow) or else bond with a similar phenoxy radical from another monomer to form the undesired first cross-linked monomer 605.

However, with the presence of the radical inhibitor, the phenoxy radical 603 will not bond with other phenoxy radicals 603 but will, instead, bond with the radical inhibitor, e.g., the maleic anhydride to form a first intermediate product 701 that has the maleic anhydride bonded to the hydrocarbon ring. As such, the phenoxy radical is no longer available to cross-link with other monomers, and the amount of cross-linking is reduced. By reducing the cross-linking, the overall amount of the crust 503 may be reduced.

However, in this embodiment, the reaction may continue with the first intermediate product 701 further reacting with the hydrogen radicals still present in the photoresist 107 to form either a second intermediate product 703 (with the maleic anhydride ring structure bonded to the hydrocarbon ring) or a third intermediate product 705 (with the maleic anhydride ring bonding in multiple places with the hydrocarbon ring of the photoresist monomer to form a polycyclic structure in, e.g. a 4+2 cycloaddition, Diels-Alder reaction).

Optionally at this point a treatment may be applied to the photoresist 107 (and, more specifically, to the second intermediate product 703 and the third intermediate product 705) in order to adjust the hydrophilicity of the second intermediate product 703 and the third intermediate product 705. FIG. 7B illustrates that, in an embodiment, the treatment may be performed by contacting the photoresist 107 with, e.g., a reactant 702 such as water in order to perform an hydrolysis of the maleic anhydride and generate two carboxylic acid groups, thereby adjusting the hydrophilicity of the second intermediate product 703 and the third intermediate product 705. However, while the treatment is described herein as utilizing water as the reactant 702, any suitable reactant that will modify the hydrophilicity of the second intermediate product 703 and the third intermediate product 705 may alternatively be used, and all such reactants are fully intended to be included within the scope of the embodiments.

In an embodiment the treatment may be performed by contacting the photoresist 107 (with the second intermediate product 703 and the third intermediate product 705 within the photoresist 107) with the reactant 702 (e.g., water). The contacting may be performed using, e.g., a dip process (whereby the semiconductor device 100 and the photoresist 107 are submerged into the reactant 702) or a spin-on process (in which the semiconductor device 100 and the photoresist 107 are spun while the reactant 702 is applied). In an embodiment the reactant may be applied at a temperature of between about 60° C. and about 120° C., such as about 100° C.

By being exposed to the reactant 702 within the treatment, the second intermediate product 703 and the third intermediate product 705 will further react with the reactant (e.g., water) in order to open the maleic anhydride ring to form a third product 707 and a fourth product 709. By reacting the second intermediate product 703 and the third intermediate product 705 with water, the hydrophilicity of the crust 503 can be increased, thereby rendering it easier to remove (as described further below with respect to FIG. 9).

Figure 7C:
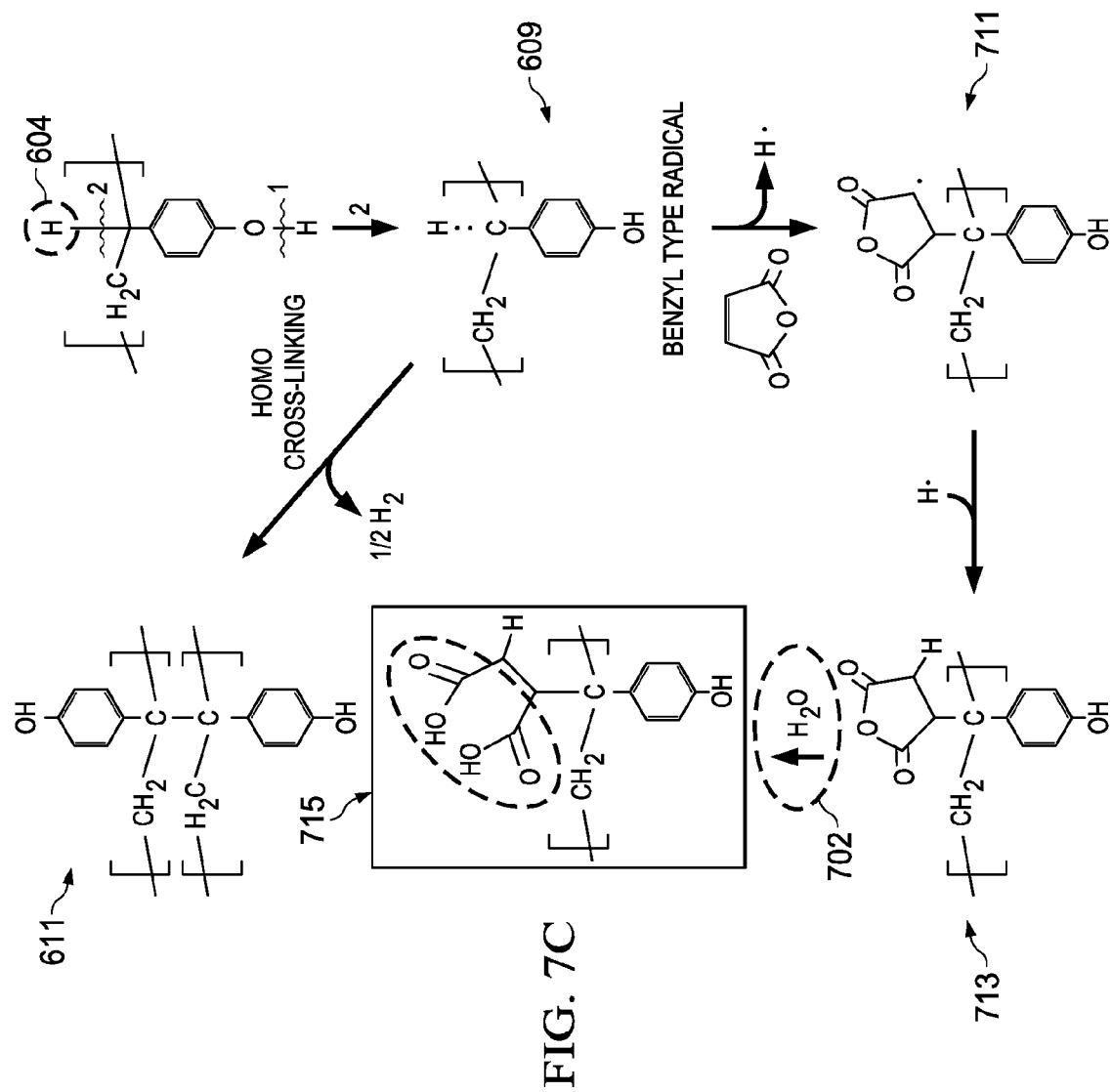

FIG. 7C illustrates another possible reaction mechanism whereby, instead of the first hydrogen atom 602 being cleaved from the oxygen on the benzene ring, the second hydrogen atom 604 bonded to the hydrocarbon backbone is cleaved to form the benzyl type radical 609. In this embodiment, with the removal of the second hydrogen atom 604 from the hydrocarbon backbone, without the radical inhibitor all of the benzyl type radicals 609 that are generated would either rebond with another H₂ (represented in FIG. 7C by the ½ H₂ arrow) or else bond with a similar benzyl type radical from another monomer to form the undesired second cross-linked monomer 611.

However, with the presence of the radical inhibitor, at least some of the benzyl type radicals 609 will not bond with other benzyl type radicals 609 but will, instead, bond with the radical inhibitor, e.g., the maleic anhydride, to form a fourth intermediate product 711 that has the maleic anhydride bonded to the hydrocarbon backbone. The fourth intermediate product 711 may then react with a hydrogen atom within the photoresist 107 to form a fifth intermediate product 713, thereby reducing the amount of cross-linking and overall reducing the crust 503.

Optionally, at this stage, the treatment described above with reference to FIG. 7B may be applied to the photoresist 107. In this embodiment, the fourth intermediate product 711 is exposed to the reactant 702 (e.g., water), at which point the fourth intermediate product 711 will react with the reactant 702 in order to open the ring of the maleic anhydride and form a fifth product 715, thereby increasing the hydrophilicity of the crust 503. Additionally, the benzyl type radical 609 is no longer available to cross-link with other monomers, and the amount of cross-linking is reduced. By reducing the cross-linking, the overall amount of the crust 503 may be reduced.

Additionally, as one of ordinary skill will recognize, the embodiments described above with respect to the chemical reaction mechanisms of FIGS. 7A and 7C are not exclusive of each other. Rather, these figures illustrate separate mechanisms that proceed along different paths, which paths may occur simultaneously to separate monomers. For example, a first monomer within the photoresist 107 may react as illustrated in FIG. 7A, while a second monomer within the photoresist 107 may simultaneously or nearly simultaneously react as illustrated in FIG. 7C, and the treatment described with respect to FIG. 7B may be applied to all of the intermediate products at the same time. All such combinations of mechanisms are fully intended to be included within the scope of the embodiments.

Figure 8:
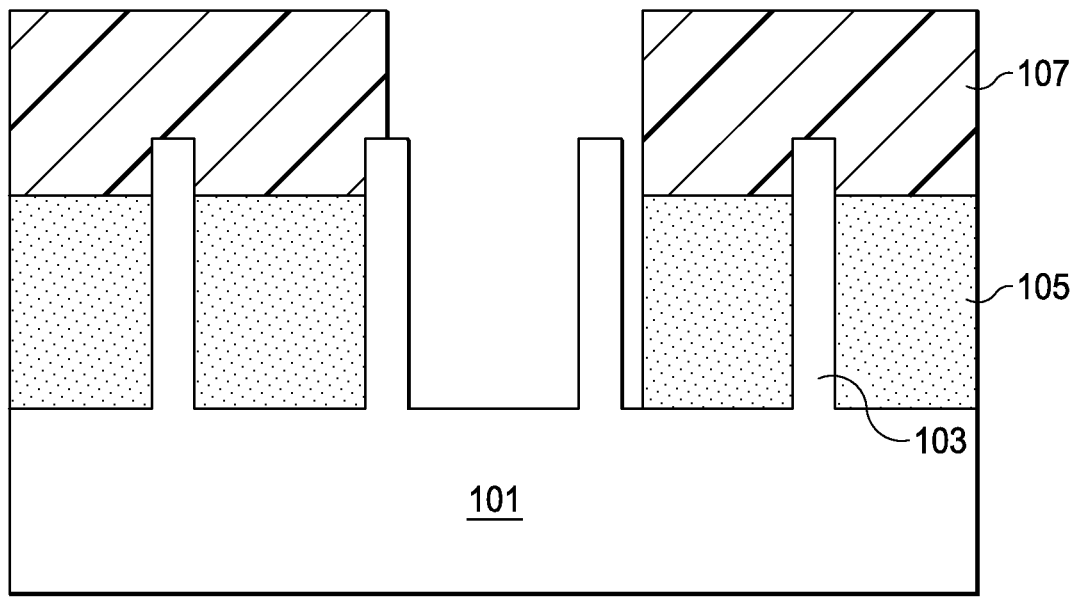
FIG. 8 illustrates a removal of the crust from the photoresist in accordance with some embodiments.

FIG. 8 illustrates one embodiment of a removal of the crust 503 (e.g., the cross-linked polymers that undesirably formed during the ion implantation process 501) prior to a removal of the remainder of the photoresist 107. By removing the crust 503 prior to removing the remainder of the photoresist 107, the stresses that are caused by the differences between the crust 503 and the photoresist 107 can be avoided, and damage that may otherwise be caused by attempting to remove the crust 503 and the photoresist 107 simultaneously may be avoided.

In an embodiment the crust 503 may be removed using a removal process such as a dry etch, in which etchants are directed towards the crust 503 in an anisotropic etching process. The etchants may be, e.g., an oxidative gas such as oxygen ($O_2$) that will oxidate the material of the crust 503 and remove the crust from the photoresist 107. However, any other suitable oxidative etchants, such as $CO_x$, $SO_x$, $NO_x$, or other etchants comprising oxygen atoms, may alternatively be removed.

Alternatively, a reductive etchant may be utilized. In such an embodiment the reducing etchant may be, e.g., hydrogen ($H_2$). However, hydrogen is not the only reductive gas that may used, as any other suitable reductive etchant, such as other gases that contain hydrogens, may alternatively be utilized. Any suitable etchant, of any type, that will remove the crust 503 from the remainder of the photoresist 107 may alternatively be utilized, and all such etchants are fully intended to be included within the scope of the embodiments.

Additionally, in an embodiment the removal process described with respect to FIG. 8 may be performed in conjunction with the use of the radical inhibitors to reduce the amount of the crust 503 that has been formed. Alternatively, the removal process described with respect to FIG. 8 may be performed when no radical inhibitors have been placed within the photoresist 107, such that the crust 503 would form and then be removed prior to a removal of the photoresist 107.

Figure 9:
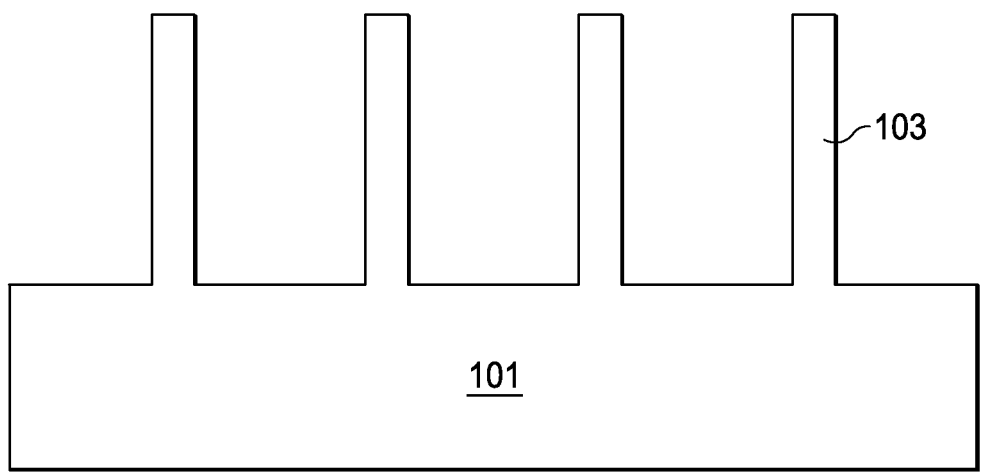
FIG. 9 illustrates a removal of the photoresist and the bottom anti-reflective coating in accordance with some embodiments.

FIG. 9 illustrates a removal of the photoresist 107 and the BARC layer 105 from the substrate 101 and the fins 103 after the removal of the crust 503. In an embodiment the photoresist 107 and the BARC layer 105 may be removed using one or more dry or wet etches. In a particular embodiment the photoresist 107 and the BARC layer 105 may be removed simultaneously using a high temperature sulfuric peroxide mixture (HTSPM) in a wet etch process.

For example, the photoresist 107 and the BARC layer 105 may be submerged in the HTSPM at a temperature of between about 150° C. and about 180° C. The HTSPM mixture may have a 3:1 concentrated sulfuric acid to 30% hydrogen peroxide, although mixtures such as 4:1 or 7:1 may alternatively be used. In an embodiment in which the HTSPM is a 3:1 mixture at between 150° C. and 180° C., the photoresist 107 and the BARC layer 105 may be submerged for a time period of between about 1 min and about 5 min, such as about 2 min, in order to fully remove the photoresist 107 and the BARC layer 105 from the substrate 101 and the fins 103.

However, HTSPM at these conditions is only intended to be an illustrative embodiment and is not intended to be limiting. Rather, any suitable removal process, such as applying SPM at a lower temperature, such as between about 100° C. and about 130° C., may alternatively be used. Additionally, other removal substances, such as SC1 ($NH_3$+$H_2O_2$) or HCl+$H_2O_2$, may also be utilized. All such removal processes are fully intended to be included within the scope of the embodiments.

Additionally, in an embodiment in which the crust 503 has been treated to increase its hydrophilicity (e.g., by using maleic anhydride along with the treatment as described above with respect to FIG. 7A-7B), the crust 503 (in an embodiment in which the crust 503 is not removed by the dry etch described above with respect to FIG. 8) or a portion of the crust 503 (in an embodiment in which the dry etch is performed but which does not remove all of the crust 503) may be removed by the same process as the photoresist 107 and the BARC layer 105 (e.g., the HTSPM wet etch). In this embodiment, because the hydrophilicity of the crust 503 has been modified by the treatment with the reactant 702, the crust 503 can be more easily removed and stresses and other problems relating to the differences in removals of the crust 503 and the remainder of the photoresist 107 may be reduced or eliminated.

Figure 10:
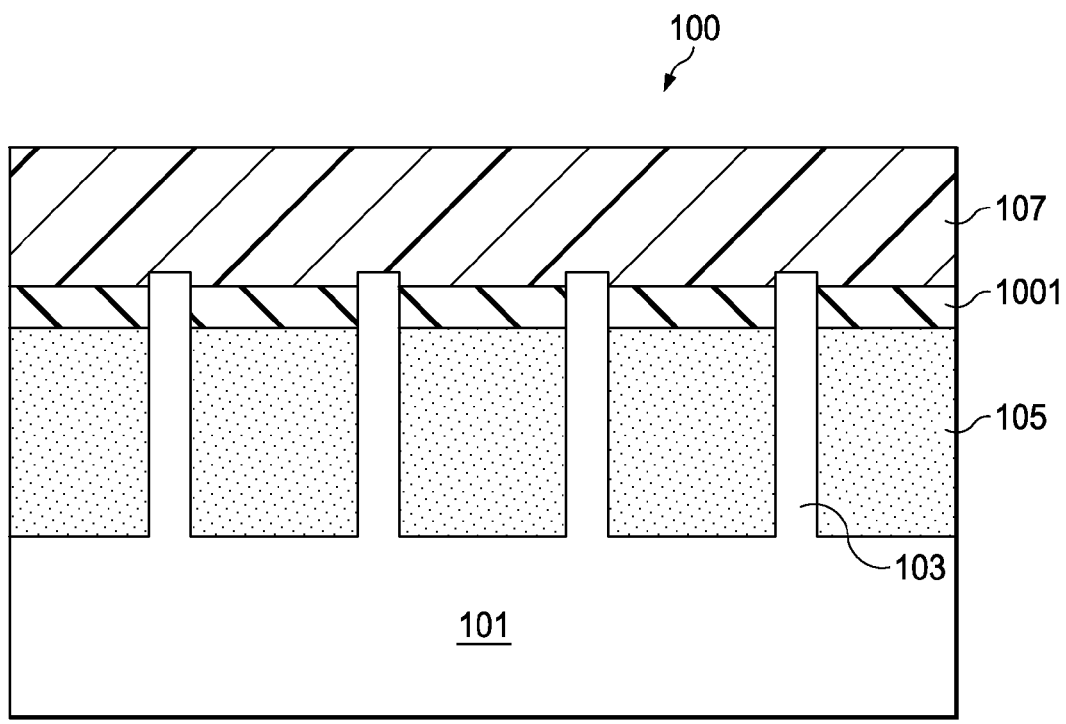
FIGS. 10-11 illustrate a tri-layer system utilizing the bottom anti-reflective coating and the photoresist in accordance with some embodiments.

FIG. 10 illustrates another embodiment in which the BARC layer 105 and the photoresist 107 are utilized together with a middle layer 1001 between the BARC layer 105 and the photoresist 107. In an embodiment the middle layer 1001 is formed on the BARC layer 105 after the formation of the BARC layer 105 has been completed and prior to the placement of the photoresist 107.

In an embodiment the middle layer 1001 may be a hard mask material such as silicon nitride, oxides, oxynitrides, silicon carbide, combinations of these, or the like. The hard mask material for the middle layer 1001 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combinations are fully intended to be included within the scope of the embodiments. The middle layer 1001 may be formed to a thickness of between about 100 Å and about 800 Å, such as about 300 Å.

Once a layer of the hard mask material for the middle layer 1001 has been formed, the photoresist 107 may be placed and patterned over the hard mask material for the middle layer 1001. The placement of the photoresist 107 over the hard mask material for the middle layer 1001 and the patterning of the photoresist 107 may be similar to the placement of the photoresist 107 and the development of the photoresist as described above with respect to FIGS. 1-3. For example, the photoresist 107 may be placed using a spin-on process, illuminated using the photoresist imaging device 200, and then developed using the developer 301.

Figure 11:
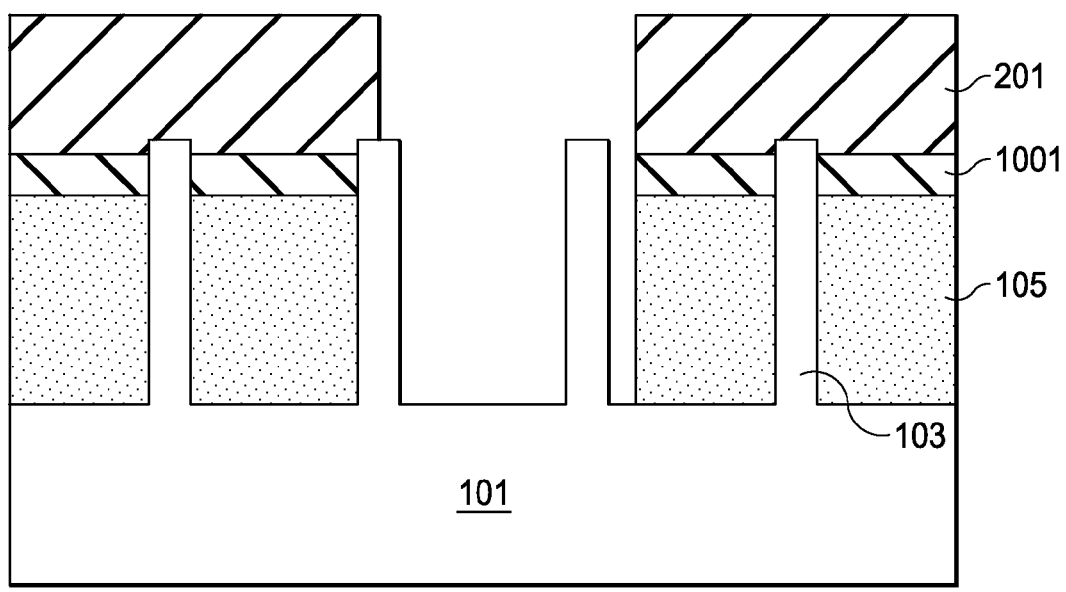

FIG. 11 illustrates that, once the photoresist 107 has been patterned into the desired pattern, the photoresist 107 may be used as a mask to pattern the hard mask material of the middle layer 1001. For example, the pattern of the photoresist 107 may be transferred to the middle layer 1001 using a anisotropic etching process such as reactive ion etching (RIE), whereby ions of a suitable etchant such as $CF_4$—$O_2$, may be utilized in a dry etch to remove portions of the middle layer 1001 exposed by the patterned photoresist 107. However, any other suitable etchant, such as $CHF_2$/$O_2$, $CH_2F_2$, $CH_3F$, or the like, and any other suitable method of removal, such as a wet stripping, may alternatively be used.

FIG. 11 further illustrates that once the pattern of the photoresist 107 has been transferred to the middle layer 1001, the middle layer 1001 may be used to transfer the pattern of the photoresist 107 to the BARC layer 105. In an embodiment the BARC layer 105 may be removed using an etching process that utilizes the photoresist 107 and the middle layer 1001 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, or even a wet etch performed simultaneously as the middle layer 1001, and any other suitable etchants may alternatively be used.

By utilizing the BARC layer 105 as an underlayer and as an anti-reflective coating, a more uniform layer may be formed over a variety of different underlying terrains. By creating a more uniform layer, subsequent processing may be better controlled, leading to a more efficient manufacturing process capable of making devices with smaller and smaller dimensions.

In accordance with an embodiment, a method of manufacturing a semiconductor device comprising applying a photoresist over a substrate, wherein the photoresist comprises a radical inhibitor, is provided. An ion implantation is performed while at least a portion of the photoresist is over the substrate, wherein the radical inhibitor reacts with radicals formed by the ion implantation.

In accordance with another embodiment, a method of manufacturing a semiconductor device comprising applying a photoresist over a substrate and patterning the photoresist to expose a portion of the substrate is provided. Ions are implanted into the substrate and the photoresist, wherein a crust is formed within a portion of the photoresist. The crust is removed from the photoresist without removing the photoresist.

In accordance with yet another embodiment, a photoresist comprising a polymer resin, a photoactive compound and a radical inhibitor is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    applying an anti-reflective coating (ARC) layer over at least a portion of a substrate;
    applying a photoresist over the ARC layer, the photoresist comprising a solvent, a polymer, a photoactive compound, and a radical inhibitor;
    performing an ion implantation while at least a portion of the photoresist is over the substrate; and
    the radical inhibitor inhibiting ion-implantation-induced cross-linking of the photoresist during ion implantation.

2. The method of claim 1, further comprising removing from the photoresist a crust formed by the performing the ion implantation.

3. The method of claim 2, further comprising removing the photoresist, wherein the removing the photoresist and the removing from the photoresist the crust are performed simultaneously.

4. The method of claim 3, wherein the removing the photoresist is performed at least in part with a sulfuric peroxide mixture.

5. The method of claim 2, further comprising removing the photoresist, wherein the removing the photoresist and the removing from the photoresist the crust are performed in separate process steps.

6. The method of claim 1, wherein the radical inhibitor is a persistent radical.

7. The method of claim 1, wherein the radical inhibitor is an alkenyl anhydride.

8. A method of manufacturing a semiconductor device, the method comprising:
    applying a photoresist over a substrate, the substrate comprising semiconductor fins, the photoresist comprising a polymer and a radical inhibitor;
    patterning the photoresist to expose a portion of the substrate;
    implanting ions into the semiconductor fins and the photoresist, wherein a photoresist crust is formed within a portion of the photoresist;
    the radical inhibitor inhibiting ion-implantation-induced cross-linking of the polymer during ion implantation to the photoresist; and
    selectively removing the photoresist crust from the photoresist without removing the photoresist.

9. The method of claim 8, wherein the removing the photoresist crust from the photoresist is performed at least in part with an oxidative etchant.

10. The method of claim 9, wherein the oxidative etchant is oxygen ($O_2$).

11. The method of claim 8, wherein the removing the photoresist crust from the photoresist is performed at least in part with a reductive etchant.

12. The method of claim 11, wherein the reductive etchant is hydrogen ($H_2$).

13. The method of claim 8, wherein the radical inhibitor comprises a persistent radical.

14. The method of claim 13, wherein the radical inhibitor comprises an alkenyl anhydride.

15. The method of claim 14, wherein the radical inhibitor is maleic anhydride.

16. A method of manufacturing a semiconductor device, the method comprising:
    applying a photoresist over a substrate, the photoresist comprising a solvent, a photoactive compound, a polymer resin, and a radical inhibitor;
    performing an ion implantation to the substrate; and
    the radical inhibitor inhibiting ion-implantation-induced cross-linking of the polymer resin.

17. The method of claim 16, wherein the radical inhibitor is a persistent radical.

18. The method of claim 17, wherein the persistent radical comprises one of:

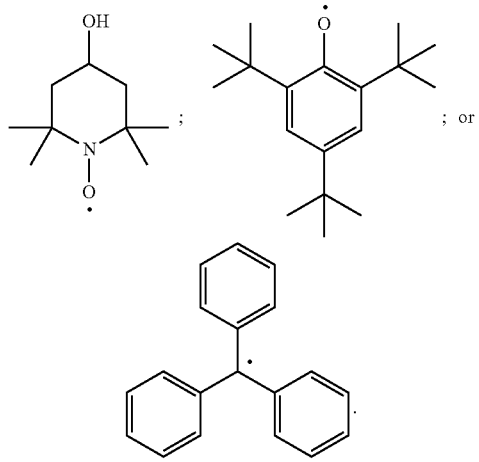

19. The method of claim 16, wherein the radical inhibitor is an alkenyl anhydride.

20. The method of claim 19, wherein the radical inhibitor is maleic anhydride.

21. The method of claim 16, further comprising the ion implantation producing a first photoresist crust layer on the photoresist, the first photoresist crust layer having a first thickness, the first thickness less than a second thickness of a second photoresist crust layer otherwise formed by ion-implantation-induced cross-linking of the photoresist without the radical inhibitor.

* * * * *